United States Patent
Lu et al.

(10) Patent No.: US 7,666,729 B2
(45) Date of Patent: Feb. 23, 2010

(54) METHOD FOR IMPROVING THE THERMAL STABILITY OF SILICIDE

(75) Inventors: Jiong-Ping Lu, Richardson, TX (US); Jiejie Xu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 422 days.

(21) Appl. No.: 11/456,595

(22) Filed: Jul. 11, 2006

(65) Prior Publication Data

US 2006/0246668 A1 Nov. 2, 2006

Related U.S. Application Data

(62) Division of application No. 10/920,547, filed on Aug. 17, 2004.

(51) Int. Cl.
*H01L 21/336* (2006.01)
*H01L 21/8238* (2006.01)

(52) U.S. Cl. .................. 438/199; 438/232; 438/197

(58) Field of Classification Search ......... 438/287–307, 438/655–664, 682–685, E29.16, 197–233
See application file for complete search history.

(56) References Cited

U.S. PATENT DOCUMENTS

| | | | | |
|---|---|---|---|---|
| 6,339,021 B1 * | 1/2002 | Tan et al. | ..................... | 438/655 |
| 6,879,007 B2 * | 4/2005 | Takamura | ................... | 438/217 |
| 6,893,909 B2 * | 5/2005 | Wang et al. | ................. | 438/166 |
| 7,205,234 B2 * | 4/2007 | Wu et al. | ..................... | 438/683 |

OTHER PUBLICATIONS

Jiong-Ping Lu et al., "A Capacitor Formed on a Recrystallized Polysilicon Layer and a Method of Manufacture Therefor" U.S. Appl. No. 10/722,013, filed Nov. 25, 2003.
J.P. Lu et al., "Nickel Salicide Technology for Sub-100NM CMOS Devices" Advanced Short-Time Thermal Processing for Si-Based CMOS Devices II, 2004, pp. 159-173, ElectroChemical Society.

* cited by examiner

*Primary Examiner*—Cuong Q Nguyen
(74) *Attorney, Agent, or Firm*—Rose Alyssa Keagy; Wade J. Brady, III; Frederick J. Telecky, Jr.

(57) ABSTRACT

An embodiment of the invention is a method of making a transistor by performing an ion implant on a gate electrode layer 110. The method may include forming an interface layer 200 over the semiconductor substrate 20 and performing an anneal to create a silicide 190 on the top surface of the gate electrode 110.

13 Claims, 5 Drawing Sheets

METHOD FOR IMPROVING THE THERMAL STABILITY OF SILICIDE

This is a division of application Ser. No. 10/920,547, filed Aug. 17, 2004.

BACKGROUND OF THE INVENTION

This invention relates to the improvement of silicide structures located within the top portion of the polysilicon gates of semiconductor transistors.

DETAILED DESCRIPTION OF THE INVENTION

Figure 1:
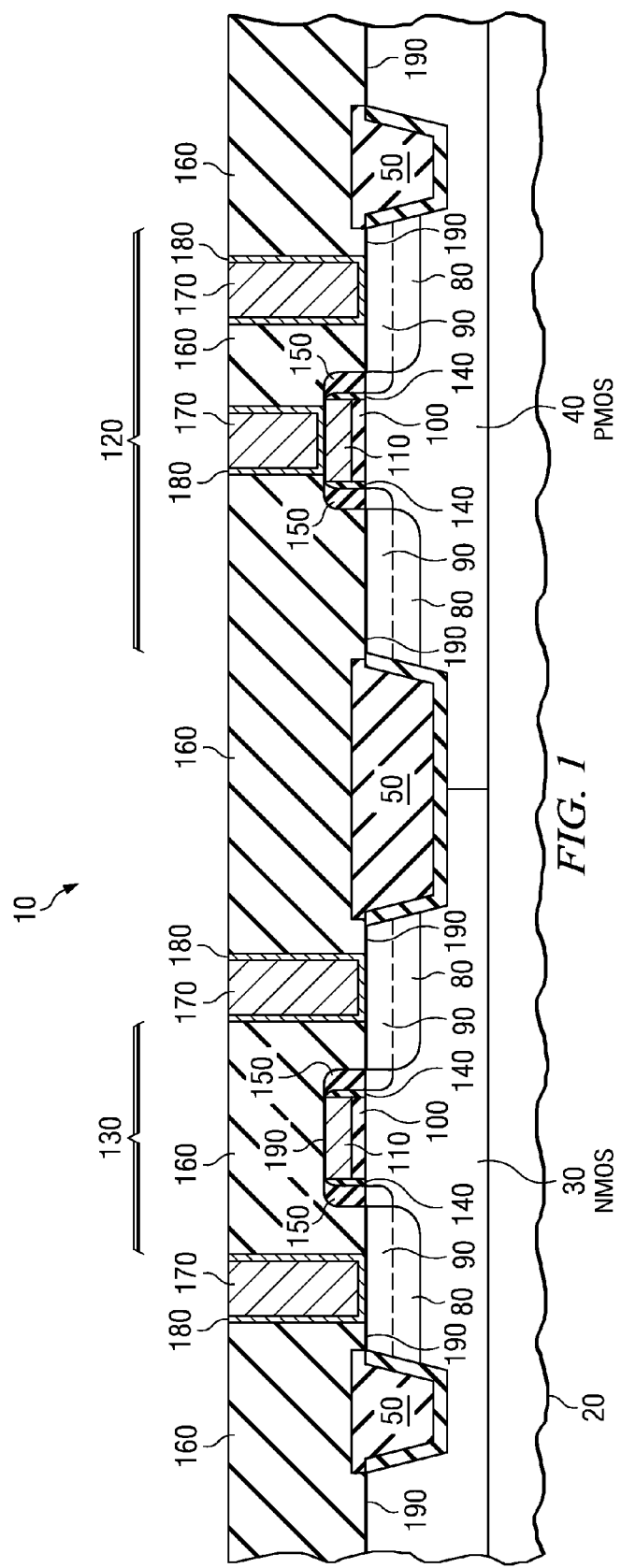
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor structure 10 in accordance with the present invention. In the example application, CMOS transistors are formed within a semiconductor substrate 20 having an NMOS region 30 and a PMOS region 40. However, it is within the scope of the invention to use a semiconductor structure 10 that contains any one of a variety of semiconductor devices, such as a bipolar junction transistor or a diode.

The CMOS transistors are electrically insulated from other active devices (not shown) by shallow trench isolation structures 50 formed within the semiconductor substrate 30, 40; however, any conventional isolation structure may be used such as field oxide regions (also known as LOCOS regions) or implanted isolation regions. The semiconductor substrate 20 is a single-crystalline substrate that is doped to be n-type and p-type; however, it may be formed by fabricating an epitaxial silicon layer on a single-crystal substrate.

Transistors are generally comprised of a gate, source, and drain. More specifically, as shown in FIG. 1, the active portion of the transistors are comprised of source/drain regions 80, source/drain extension regions 90, and a gate that is comprised of a gate oxide 100 and gate electrode 110.

The example PMOS transistor 120 is a p-channel MOS transistor. Therefore it is formed within a n-well region 40 of the semiconductor substrate 20. In addition, the source and drain regions 80 (as well as the medium doped source and drain extension regions 90) have p-type dopants. The PMOS gate is created from p-type doped polysilicon 110 and a gate oxide dielectric 100.

Similarly, the example NMOS transistor 130 is a n-channel MOS transistor. Therefore it is formed within a p-well region 30 of the semiconductor substrate 20. In addition, the source and drain regions 80 (as well as the medium doped source and drain extension regions 90) have n-type dopants. The NMOS gate is created from n-type doped polysilicon 110 and a gate oxide dielectric 100.

A sidewall structure comprising offset layers 140, 150 are used during fabrication to enable the proper placement of the source/drain regions 80 and the source/drain extension regions 90. Usually the source/drain extension regions 90 are formed using the gate stack 100, 110 and extension sidewalls 140 as a mask. Furthermore, the source/drain regions 80 are usually formed with the gate stack 100, 110 and source/drain sidewalls 150 as a mask.

Immediately above and surrounding the transistors is a layer of dielectric insulation 160. The composition of dielectric insulation 160 may be any suitable material such as $SiO_2$ or organosilicate glass (OSG). The dielectric material 160 electrically insulates the metal contacts 170 that electrically connect the CMOS transistors shown in FIG. 1 to other active or passive devices (not shown) located throughout the semiconductor substrate 20. An optional dielectric liner (not shown) may be formed before the placement of the dielectric insulation layer 160. If used, the dielectric liner may be any suitable material such as silicon nitride.

In the example application, the contacts 170 are comprised of W; however, any suitable material (such as Cu, Ti, or Al) may be used. In addition, an optional liner material 180 such as Ti, TiN, or Ta (or any combination or layer stack thereof) may be used to reduce the contact resistance at the interface between the liner 180 and the silicided regions 190 of the gate electrode 110 and source/drain regions 80.

Subsequent fabrication will create the back-end portion of the integrated circuit. The back-end generally contains one or more interconnect layers (and possibly via layers) that properly route electrical signals and power though out the completed integrated circuit.

The purpose of the silicide layer 190 formed within top portion of the gate electrode 110 and the source/drain regions 80 is the reduction of the contact resistance between the transistor and the electrical contacts 170, 180. In accordance with the invention, the silicide 190 is NiSi. However, it is within the scope of the invention to use a different silicide, such as $CoSi_2$.

The NiSi silicide 190 formed within the gate electrode 110 in accordance with the invention is more resistant to thermal induced agglomeration throughout subsequent fabrication processes than standard silicides. This result is achieved by modifying the surface structure of the gate electrode 110 with an ion implantation step that is performed early in the fabrication process; as discussed more fully below.

Figure 2A:
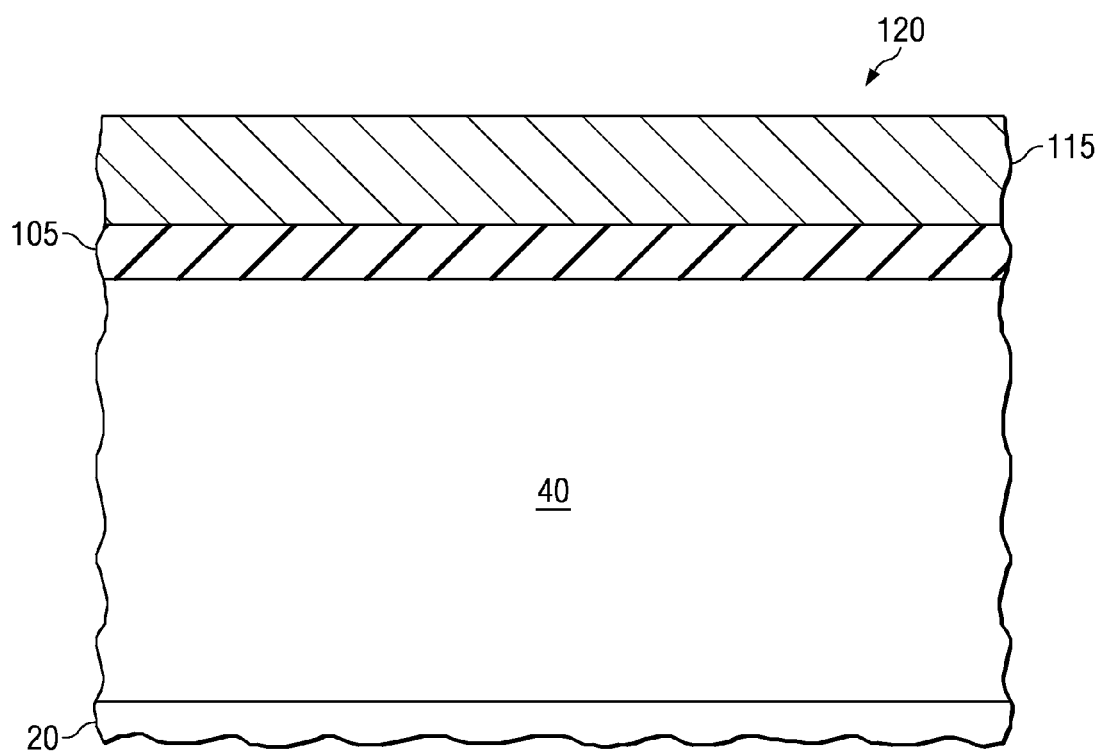
FIGS. 2A-2G are cross-sectional diagrams of a process for forming a transistor in accordance with the present invention.
Figure 2B:
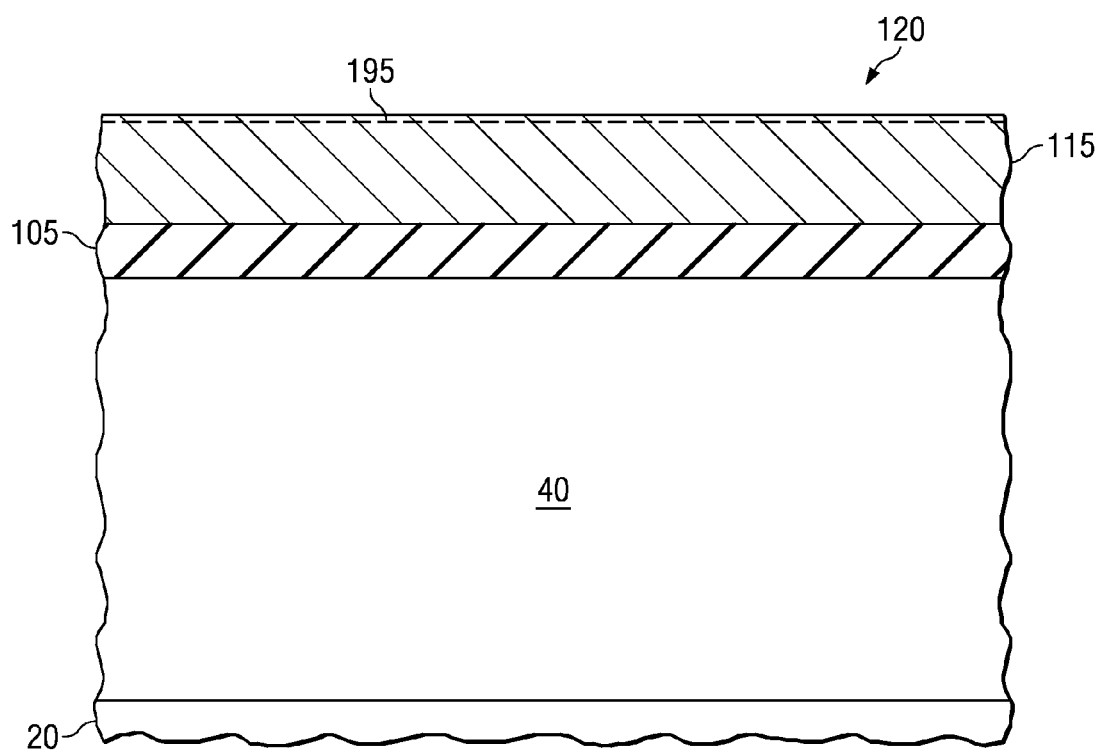
Figure 2C:
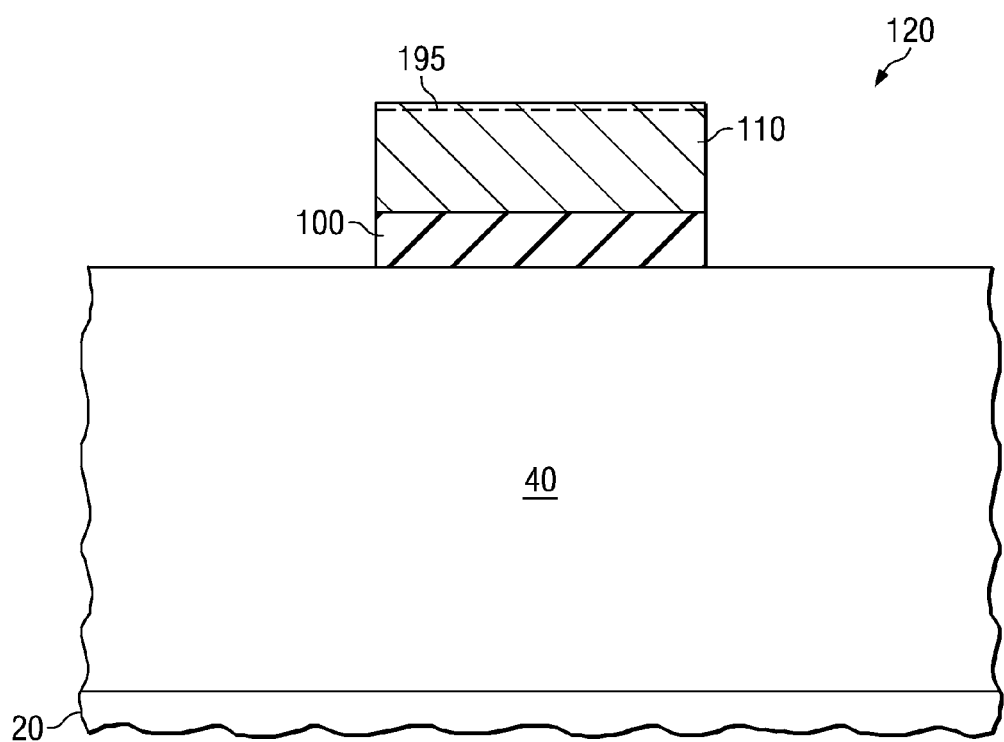
Figure 2D:
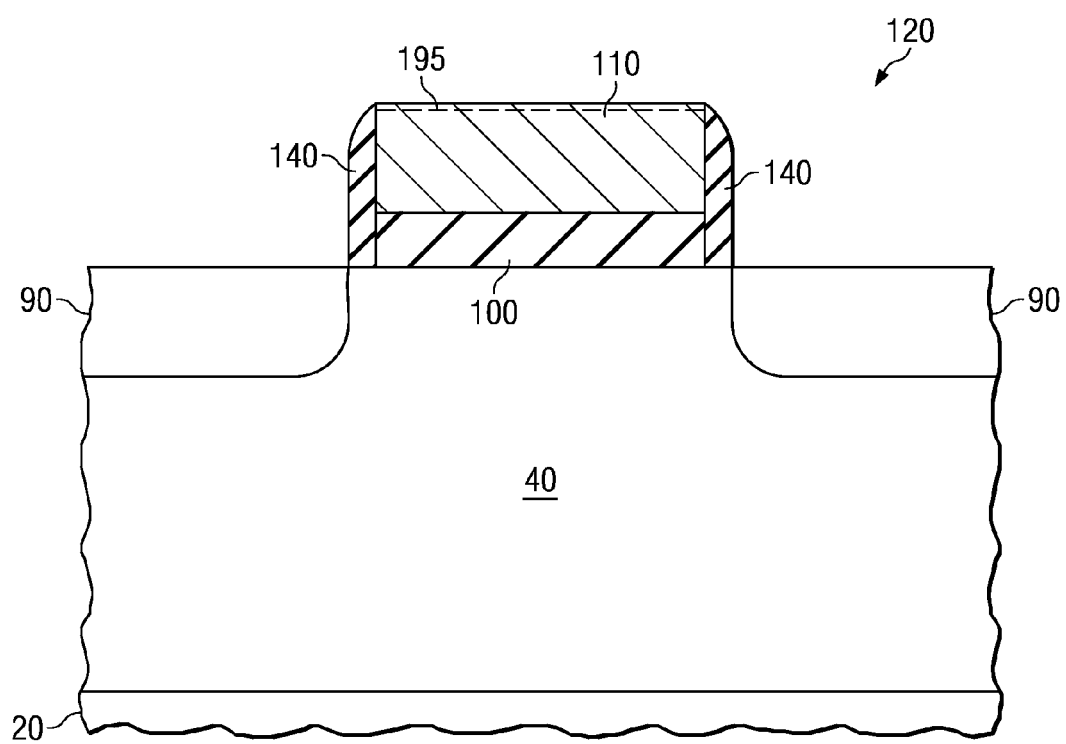
Figure 2E:
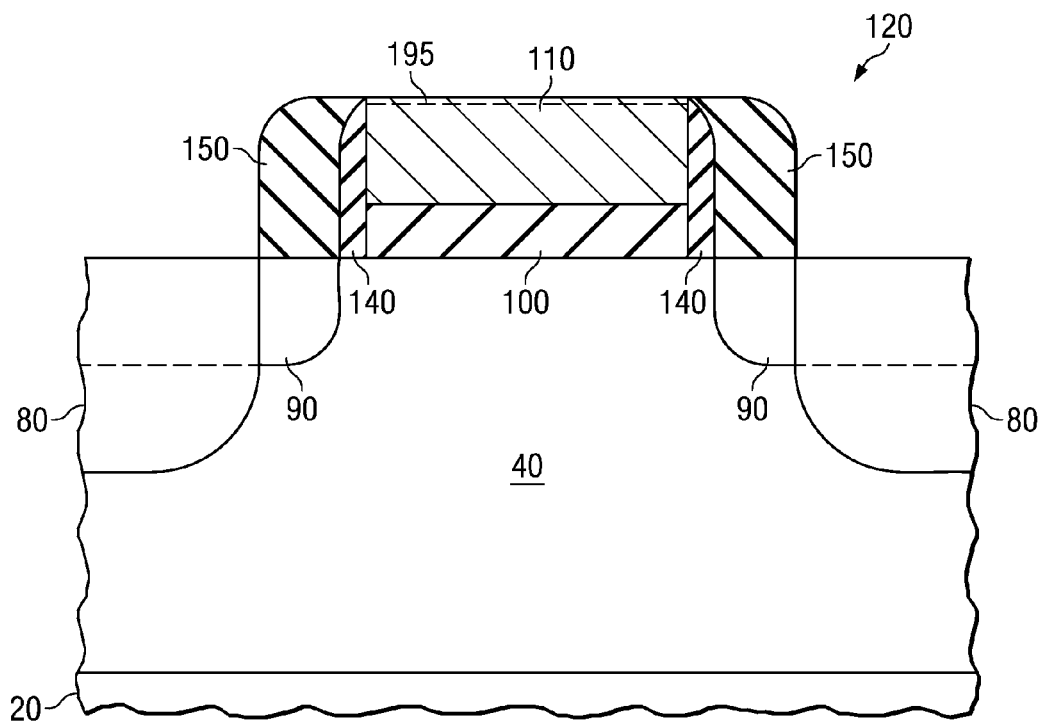
Figure 2F:
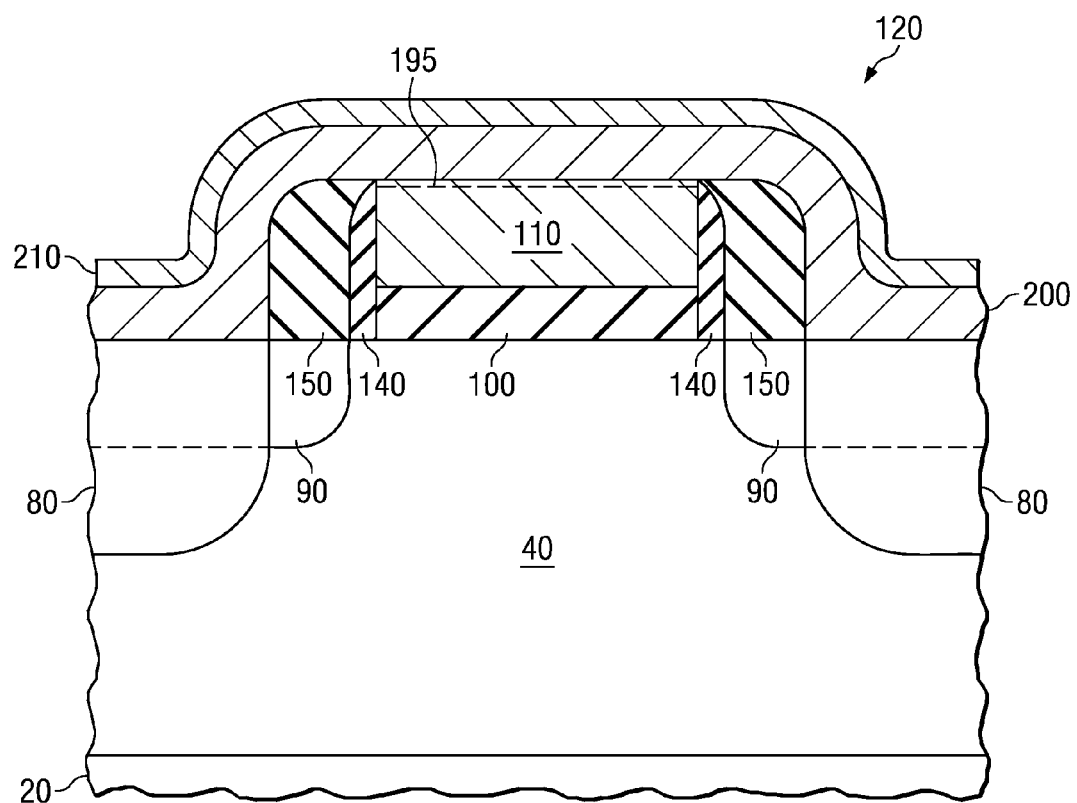
Figure 2G:
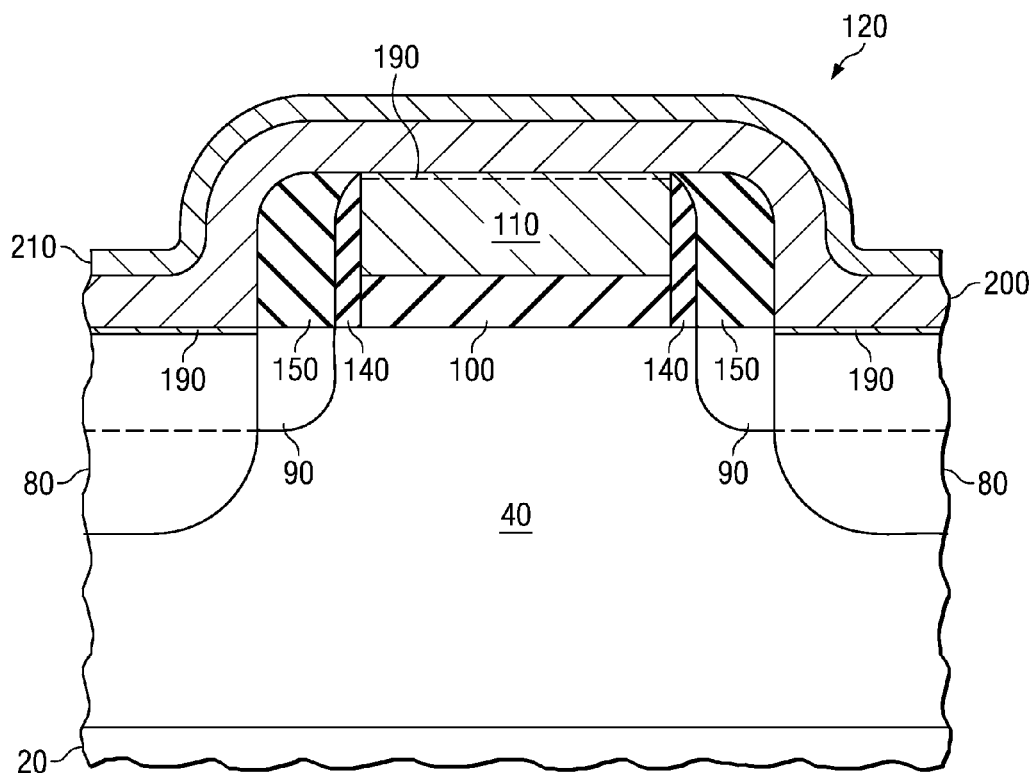

Referring again to the drawings, FIGS. 2A 2G are cross-sectional views of a partially fabricated semiconductor wafer illustrating a process for forming an example PMOS transistor 120 in accordance with one embodiment of the present invention. Those skilled in the art of semiconductor fabrication will easily understand how to modify this process to manufacture other types of transistors (such as a NMOS transistor) in accordance with this invention.

FIG. 2A is a cross-sectional view of a transistor structure 120 after the formation of the shallow trench isolation structures 50 (not shown) and the gate layers 105, 115 on the top surface of a semiconductor substrate 20.

In the example application, the semiconductor substrate 20 is silicon; however any suitable material such as germanium or gallium arsenide may be used. The example PMOS transistor 120 is formed within a n-well region 40 of the semiconductor substrate 20.

The first layer formed over the surface of the semiconductor substrate 20 is a gate dielectric layer 105. As an example, the gate dielectric layer 105 is silicon dioxide formed with a thermal oxidation process. However, the gate dielectric layer 105 may be any suitable material, such as nitrided silicon oxide, silicon nitride, or a high-k gate dielectric material, and may be formed using any one of a variety of processes such as an oxidation process or thermal nitridation.

A gate electrode layer 115 is then formed on the surface of the gate oxide layer 105. The gate electrode layer 115 is comprised of polycrystalline silicon in the example application. However, it is within the scope of the invention to use other materials such as an amorphous silicon, a silicon alloy, or other suitable materials. The gate electrode 115 may be formed using any process technique such as chemical vapor deposition (CVD) or physical vapor deposition (PVD).

In accordance with the best mode of the invention, an ion implant is performed after the formation of the gate electrode layer 115. This ion implant will influence the structure of the silicide 190 that is formed later in the fabrication process (and described more fully below). The best mode ion implant is an $Ar^+$ ion implant, which modifies the surface structure of the gate electrode layer 115. Any suitable machine may be used to perform the ion implant such as the xRLeapII or the xRLeapQ (made by Applied Materials), the GSD Ultra or the GSD HC $E^2$ (made by Axcelis Technologies), or the VIISTA80 (made by Varian Semiconductor Equipment).

In the best mode application, an $Ar^+$ ion implant is performed using the Axcelis Technologies GSD Ultra ion implanter. The implant angle is 0-10°; however, 0° is preferred. In addition, the implant energy may range from 5-35 keV; however, approximately 10 keV is preferred. Furthermore, the implant dose may range from $1 \times 10E^{15}$ $5 \times 10E^{15}$; however, approximately $2 \times 10E^{15}$ is preferred. Moreover, the beam current may range from 3-12 mA; however, approximately 8 mA is preferred. It is to be noted that this ion implant may be followed by a standard post ion implant clean. As shown in FIG. 2B, the ion implant will create an ion implant region 195 within the top portion of the gate electrode layer 115. At this stage of fabrication process the ion implant region 195 is amorphous.

It is within the scope of the invention to use other gases for the ion implant. $Ar^+$ is used for the ion implant gas in the best mode application because it affects the physical structure of the surface of the gate electrode layer 115. Another gas that would also affect the physical structure of the surface of gate electrode layer 115 is $Sb^+$. Example of other gases that could be used for the ion implant are $N_2^+$ and $F^+$. If used, $N_2^+$ and $F^+$ would affect the chemical structure (rather than the physical structure) of the surface region of the gate electrode layer 115.

After a pattern and etch process, a gate stack having a gate dielectric 100 and a gate electrode 110 will be formed from the gate dielectric layer 105 and the gate electrode layer 115 (including the ion implant area 195). This gate stack, shown in FIG. 2C, may be created through a variety of processes. For example, the gate stack may be created by forming a layer of photoresist over the semiconductor wafer, patterning the photoresist, and then using the photoresist pattern to etch both the gate oxide layer 105 and the gate electrode layer 115. The gate stack may be etched using an suitable etch process, such as an anisotropic etch.

The fabrication of the PMOS transistor 120 now continues with standard process steps. Generally, the next step in the fabrication of the PMOS transistor 120 is the formation of the extension regions 90.

As shown in FIG. 2D, extension sidewalls 140 are formed on the outer surface of the gate stack. The extension sidewalls 140 may be comprised of an oxide, oxi-nitride, silicon dioxide, nitride, or any other dielectric material or layers of dielectric materials. Furthermore, the extension sidewalls 140 may be formed with any suitable process, such as thermal oxidation, deposited oxide, CVD, or PVD.

These extension sidewalls 140 are now used as a template to facilitate the proper placement of the extension regions 90. However, it is within the scope of the invention to form the extension regions 90 at any point in the manufacturing process.

The extension regions 90 are formed near the top surface of the semiconductor substrate 40 using any standard process. For example, the extension regions 90 may be formed by low-energy ion implantation, a gas phase diffusion, or a solid phase diffusion. The dopants used to create the extension regions 90 for a PMOS transistor 120 are p-type (i.e. boron). However, other dopants or combinations of dopants may be used.

In the example application shown in FIG. 2D, the extension sidewalls 140 are used to direct the dopant implantation to the proper location 90 within the semiconductor substrate 40. Thus, the source and drain extension regions 90 initiate from points in the semiconductor substrate 40 that are approximately at the outer corner of the extension sidewalls 140.

At some point after the implantation of the extension regions 90, the extension regions 90 are activated by an anneal process (performed now or later). This anneal step may be performed with any suitable process such as rapid thermal anneal (RTA). The annealing process will likely cause a lateral migration of each extension region toward the opposing extension region (as shown in FIG. 1).

Referring to FIG. 2E, source/drain sidewalls 150 are now formed proximate to the extension sidewalls 140. The source/drain sidewalls 150 may be formed using any standard process. For example, the source/drain sidewalls 150 may be comprised of an oxide and/or a nitride that is formed with a CVD process and subsequently anisotropically etched. Now the source/drain sidewalls 150 are used as a template for the source/drain implantation step. However, it is within the scope of the invention to form the source/drain regions 80 at another point in the manufacturing process.

The source/drain regions 180 may be formed through any one of a variety of processes, such as deep ion implantation or deep diffusion. The dopants used to create the source/drain regions 80 for a PMOS transistor are typically boron; however, other dopants or combinations for dopants may be used.

The implantation of the dopants is self-aligned with respect to the outer edges of the source/drain sidewalls 150. However, it is to be noted that due to lateral straggling of the implanted species, the source/drain regions 80—as well as the extension regions 90—initiate slightly inside the outer corner of the sidewalls 140, 150 respectively.

In the example application, the source/drain regions 80 are activated by a second anneal step. (However, the extension region anneal and the source/drain region anneal may be combined and performed at this point in the fabrication process.) This anneal step acts to repair the damage to the semiconductor wafer and to activate the dopants. The activation anneal may be performed by any technique such as RTA, flash lamp annealing (FLA), or laser annealing. This anneal step often causes lateral and vertical migration of dopants in the extension regions 90 and the source/drain regions 80.

In addition, this anneal step will cause the recrystallization of the ion implant region 195 (or the full crystallization of the ion implant region 195 if this is the first anneal). The surface of the recrystallized ion implant region 195 is much smoother than the surface of a gate electrode 110 that has not been subject to the ion implant process in accordance with the invention. The result is an improved thermal stability of the silicide 190 formed within the top portion of the gate electrode 110 later in the fabrication process.

As shown in FIG. 2F, the interface layer 200 is now formed over the top surface of the semiconductor wafer. The interface layer is preferably comprised of Ni; however, other suitable materials such as Co may be used.

An optional capping layer 210 may also be formed over the interface layer 200. If used, the capping layer 210 acts as a passivation layer that prevents the diffusion of oxygen from ambient into the interface layer 200. The capping layer may be any suitable material, such as TiN.

In accordance with the invention, the semiconductor wafer is now annealed with any suitable process, such as RTA. This anneal process will cause a silicide 190 (i.e. a Ni-rich silicide or Ni mono-silicide) to form at the surface of the source/drain regions 80 and at the surface of the gate electrode 110 that was previously modified by the $Ar^+$ ion implantation. These silicide regions 190 are shown in FIG. 2G. It is to be noted that the interface layer 200 will only react with the active substrate (i.e. exposed Si); namely, the gate electrode 110 and the source/drain 80. Therefore, the silicide 190 formed by the annealing process is considered a self-aligned silicide (salicide). It is also to be noted that the surface of source/drain regions 80 was not modified by the $Ar^+$ ion implant because the source/drain regions 80 were protected during the earlier ion implant step by the polysilicon of the gate electrode layer 115.

The fabrication of the semiconductor wafer now continues, using standard process steps, until the semiconductor device is complete (see FIG. 1). Generally, the next step is the removal of the unwanted portions of the interface layer 200 (and capping layer 210) through a wet etch process (i.e. using a mixture of sulfuric acid, hydrogen peroxide, and water).

It is within the scope of the invention to perform a second anneal (such as a RTA) at this point in the manufacturing process in order to further react the silicide 190 with the gate electrode 110 and the source/drain regions 80. If the initial anneal process did not complete the silicidation process, this second anneal will ensure the formation of a mono-silicide NiSi which lowers the sheet resistance of the silicide 190.

Next, the dielectric insulator layer 160 may be formed using plasma-enhanced chemical vapor deposition (PECVD) or another suitable process. The dielectric insulator 160 may be comprised of any suitable material such as $SiO_2$ or OSG.

The contacts 170 are formed by etching the dielectric insulator layer 160 to expose the desired gate, source and/or drain. An example etch process is anisotropic etch. The etched spaces are usually filled with a liner 180 to improve the electrical interface between the silicide 190 and the contact 170. Then contacts 170 are formed within the liner 180; creating the electrical interconnections between various semiconductor components located within the semiconductor substrate 20.

As discussed above, the fabrication of the final integrated circuit continues with the fabrication of the back-end structure. Once the fabrication process is complete, the integrated circuit will be tested and then packaged.

Figure 3:
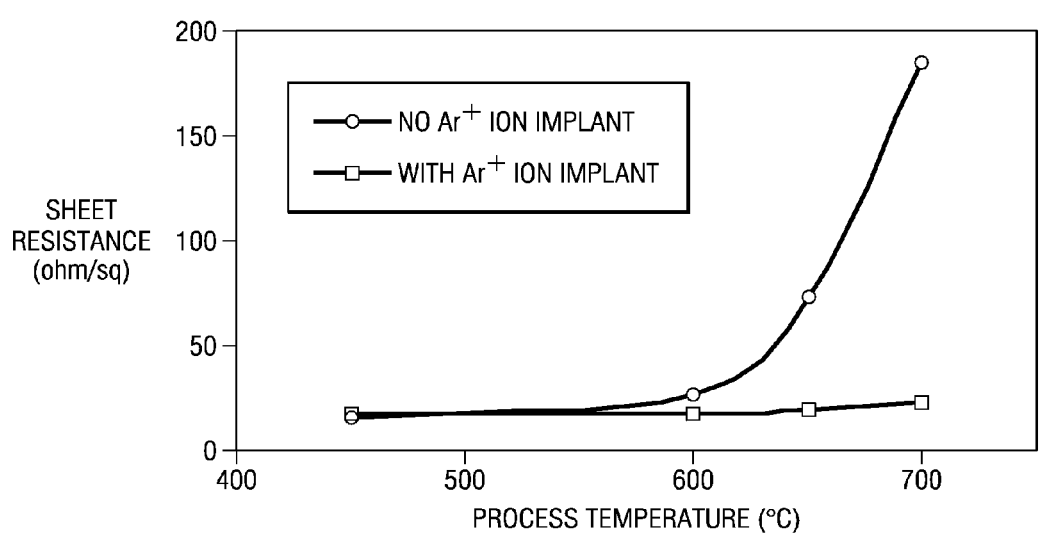
FIG. 3 is a graphical comparison of the sheet resistance (as a function of process temperature) of a standard silicide and a silicide formed in accordance with the principles of the present invention.

The ion implantation of the gate electrode 110 before the formation of the gate stack in accordance with the invention will help to prevent thermal induced agglomeration of the silicide 190 during subsequent fabrication processes. As shown in FIG. 3, the NiSi layer 190 formed within the gate electrode 110 after an ion implant process is more stable at higher process temperatures (as measured by the sheet resistance) than a NiSi layer formed without the inventive process. Therefore, the silicide 190 formed in accordance with this invention will have an improved thermal stability and will therefore withstand higher manufacturing process temperatures (i.e. over 500° C.) during subsequent processing steps.

One of the variations to the present invention is to perform the ion implant after the source/drain implant but before the anneal of the source/drain regions. Using this alternative fabrication process, standard manufacturing steps would be used to build the transistor 120 to the point of the implant of the source/drain regions 80. An $Ar^+$ ion implant would then be performed (using the ion implant machines and process parameters listed above) subsequent to the dopant implant of the source/drain regions 80 but prior to the source/drain anneal. This ion implant would modify the top surface of the gate electrode 110 as described above, creating a ion implant area 195. Next, a source/drain anneal (preferably using a RTA process) would be performed and then the interface layer 200 would be formed over the surface of the semiconductor wafer. After a suitable annealing process, such as RTA, a silicide 190 would be formed on the top surface of the gate electrode 110. The fabrication process would then continue with standard process steps. However, the silicide 190 formed with this alternative process flow will help to prevent thermal induced agglomeration of the silicide 190 during subsequent fabrication processes.

Various additional modifications to the invention as described above are within the scope of the claimed invention. As an example, interfacial layers may be formed between any of the layers shown. Similarly, any of the sidewall layers described in the example application may be omitted. For example, the extension sidewalls 140 may be omitted without departing from the scope of the invention. Moreover, if extension sidewalls 140 are omitted than the thickness of source/drain sidewalls 150 may be increased.

It is to be noted that an anneal process may be performed after any step in the above-described fabrication process. For instance, an annealing step may be performed after the implantation of the source/drain extension regions 90 but before the formation of the source/drain sidewalls 150. When used, the anneal process can improve the microstructure of materials and thereby improve the quality of the semiconductor structure.

This invention may be implemented in a sidewall spacer structure that is comprised of different materials or layers than is described above. In addition, this invention may be implemented in other semiconductor structures such as capacitors or diodes, and also in different transistor structures such as biCMOS and bipolar transistors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for forming a silicide on a gate of a transistor, comprising:
   providing a semiconductor substrate;
   forming a gate dielectric layer over said semiconductor substrate;
   forming a gate electrode layer over said gate dielectric layer;
   performing an $Ar^+$ ion implant within a top portion of said gate electrode layer and leaving a bottom portion of said gate electrode free of $Ar^+$ ions from said $Ar^+$ ion implant;
   etching said gate electrode layer and said gate dielectric layer to form a gate stack having a gate electrode and a gate dielectric;
   forming extension sidewalls coupled to said gate stack;
   implanting extension regions within a top surface of said semiconductor substrate;
   forming source/drain sidewalls coupled to said extension sidewalls;
   implanting source/drain regions within a top surface of said semiconductor substrate;
   annealing said semiconductor substrate to recrystallize a surface region of said gate electrode modified by said $Ar^+$ ion implant;
   forming an interface layer over said semiconductor substrate, said interface layer including Ni; and
   performing a rapid thermal anneal to create a nickel silicide within said surface region of said gate electrode.

2. The method of claim 1 further including the step of forming a cap layer over said interface layer prior to said step of performing a rapid thermal anneal.

3. The method of claim 1 further comprising:
   performing a second rapid thermal anneal subsequent to said step of performing a rapid thermal anneal.

4. A method for forming a silicide on a gate of a transistor, comprising:
   providing a semiconductor substrate;
   forming a gate dielectric layer over said semiconductor substrate;
   forming a gate electrode layer over said gate dielectric layer;
   etching said gate electrode layer and said gate dielectric layer to form a gate stack having a gate electrode and a gate dielectric;
   forming extension sidewalls coupled to said gate stack;
   implanting extension regions within a top surface of said semiconductor substrate;
   forming source/drain sidewalls coupled to said extension sidewalls;
   implanting source/drain regions within a top surface of said semiconductor substrate;
   performing an $Ar^+$ ion implant within a top portion of said gate electrode and leaving a bottom portion of said gate electrode free of $Ar^+$ ions from said $Ar^+$ ion implant;
   annealing said semiconductor substrate;
   forming an interface layer over said semiconductor substrate; and
   performing an anneal to create a silicide on a top surface of said gate electrode.

5. The method of claim 4 wherein said gate electrode layer comprises polycrystalline silicon.

6. The method of claim 4 wherein said gate electrode layer comprises amorphous silicon.

7. The method of claim 4 wherein said transistor is a CMOS transistor.

8. The method of claim 4 wherein said transistor is a PMOS transistor.

9. The method of claim 4 wherein said transistor is a NMOS transistor.

10. The method of claim 4 wherein said anneal to create a silicide is a rapid thermal anneal.

11. The method of claim 4 wherein said interface layer comprises Ni.

12. The method of claim 4 wherein said interface layer comprises Co.

13. The method of claim 4 wherein said silicide is a self-aligned silicide.

* * * * *

UNITED STATES PATENT AND TRADEMARK OFFICE
CERTIFICATE OF CORRECTION

PATENT NO. : 7,666,729 B2  Page 1 of 1
APPLICATION NO. : 11/456595
DATED : February 23, 2010
INVENTOR(S) : Lu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 570 days.

Signed and Sealed this

Twenty-eighth Day of December, 2010

David J. Kappos
*Director of the United States Patent and Trademark Office*